(12) United States Patent
Ueta et al.

(10) Patent No.: US 11,318,929 B2
(45) Date of Patent: May 3, 2022

(54) ELECTRONIC CONTROL APPARATUS, ELECTRONIC CONTROL SYSTEM, AND ELECTRONIC CONTROL METHOD

(71) Applicant: Hitachi Automotive Systems, Ltd., Hitachinaka (JP)

(72) Inventors: Taisuke Ueta, Tokyo (JP); Satoshi Tsutsumi, Tokyo (JP); Hideki Endo, Tokyo (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 429 days.

(21) Appl. No.: 16/470,455

(22) PCT Filed: Nov. 22, 2017

(86) PCT No.: PCT/JP2017/042088
§ 371 (c)(1),
(2) Date: Jun. 17, 2019

(87) PCT Pub. No.: WO2018/116737
PCT Pub. Date: Jun. 28, 2018

(65) Prior Publication Data
US 2020/0114905 A1 Apr. 16, 2020

(30) Foreign Application Priority Data
Dec. 19, 2016 (JP) .............................. JP2016-245896

(51) Int. Cl.
*B60W 30/06* (2006.01)
*B60W 50/00* (2006.01)
(Continued)

(52) U.S. Cl.
CPC .............. *B60W 30/06* (2013.01); *B60R 16/02* (2013.01); *B60W 50/00* (2013.01); *G06F 8/65* (2013.01);
(Continued)

(58) Field of Classification Search
CPC ....... B60W 30/06; B60W 50/00; B60R 16/02; G06F 8/65; G06F 9/445; H03K 19/17744
(Continued)

(56) References Cited

U.S. PATENT DOCUMENTS

2006/0010230 A1\* 1/2006 Karklins ............ G05B 19/4185
709/223
2007/0150718 A1 6/2007 Toi et al.
(Continued)

FOREIGN PATENT DOCUMENTS

CN 1860448 A 11/2006
CN 101626937 A 1/2010
(Continued)

OTHER PUBLICATIONS

International Search Report (PCT/ISA/210) issued in PCT Application No. PCT/JP2017/042088 dated Feb. 27, 2018 with English translation (four (4) pages).
(Continued)

*Primary Examiner* — Gertrude Arthur Jeanglaude
(74) *Attorney, Agent, or Firm* — Crowell & Moring LLP

(57) ABSTRACT

Provided is an electronic control apparatus including a reconfigurable logic circuit. The electronic control apparatus includes an information collection unit which collects information and a processing determination unit which determines a combination of processing information to be executed by the logic circuit, from a processing information storage unit that stores a plurality of pieces of processing information, on the basis of the collected information. The logic circuit is reconfigured on the basis of the combination of processing information determined by the processing determination unit.

8 Claims, 11 Drawing Sheets

(51) Int. Cl.
  *B60R 16/02* (2006.01)
  *G06F 8/65* (2018.01)
  *G06F 9/445* (2018.01)
  *H03K 19/17736* (2020.01)

(52) U.S. Cl.
  CPC ....... *G06F 9/445* (2013.01); *H03K 19/17744* (2013.01)

(58) Field of Classification Search
  USPC .......................................................... 701/36
  See application file for complete search history.

(56) References Cited

U.S. PATENT DOCUMENTS

| | | | |
|---|---|---|---|
| 2009/0278915 | A1 | 11/2009 | Kramer et al. |
| 2010/0090069 | A1 | 4/2010 | Degouge et al. |
| 2011/0022995 | A1 | 1/2011 | Yamada |
| 2011/0276209 | A1 | 11/2011 | Suganuma et al. |
| 2015/0051775 | A1* | 2/2015 | Gotoh .................. B60W 10/06 701/22 |

FOREIGN PATENT DOCUMENTS

| | | |
|---|---|---|
| CN | 102112945 A | 6/2011 |
| CN | 102224047 A | 10/2011 |
| CN | 103955920 A | 7/2014 |
| CN | 104571042 A | 4/2015 |
| JP | 2005-35396 A | 2/2005 |
| JP | 2006-282072 A | 10/2006 |
| JP | 2007-179358 A | 7/2007 |
| JP | 2007-237913 A | 9/2007 |
| JP | 2008-33702 A | 2/2008 |
| JP | 2011-28333 A | 2/2011 |

OTHER PUBLICATIONS

Japanese-language Written Opinion (PCT/ISA/237) issued in PCT Application No. PCT/JP2017/042088 dated Feb. 27, 2018 (five (5) pages).

Chinese-language Office Action issued in Chinese Application No. 201780074995.8 dated Sep. 27, 2021 with English translation (18 pages).

* cited by examiner

FIG. 3

| MODE SELECTION CONDITION | OPERATION MODE |
|---|---|
| SENSOR PARAMETER: EXPRESSWAY ENTRANCE | MODE 1 |
| AUTOMATIC DRIVING BUTTON: PARKING | MODE 2 |
| FAILURE DETECTION: ECU ABNORMALITY | MODE 3 |
| ⋮ | ⋮ |

FIG. 4

| OPERATION MODE | DIVISION NUMBER | NUMBER OF TIMES | ORDER 1 | ORDER 2 | ORDER 3 | CONNECTION INFORMATION | PROCESSING INFORMATION 1 | PROCESSING INFORMATION 2 | PROCESSING INFORMATION 3 |
|---|---|---|---|---|---|---|---|---|---|
| MODE 1 | 1 | 3 | ○ | ○ | ○ | CONNECTION: I1 | CIRCUIT: A1<br>TIME: T11 | CIRCUIT: A2<br>TIME: T12 | CIRCUIT: A3<br>TIME: T13 |
| MODE 2 | 2 | 2 | ○ | ○ |   | CONNECTION: I2 | CIRCUIT: B1<br>TIME: T21 | CIRCUIT: B2<br>TIME: T22 | CIRCUIT: B3<br>TIME: T23 |
|  |  | 1 |   |   | ○ |  |  |  |  |
| MODE 3 | 3 | 1 | ○ |   |   | CONNECTION: I3 | CIRCUIT: C1<br>TIME: T31 | CIRCUIT: C2<br>TIME: T32 | CIRCUIT: C3<br>TIME: T33 |
|  |  | 1 |   | ○ |   |  |  |  |  |
|  |  | 1 |   |   | ○ |  |  |  |  |
| ⋮ | ⋮ | ⋮ | ⋮ |  |  | ⋮ | ⋮ | ⋮ | ⋮ |

- 401: OPERATION MODE
- 402: (402-1 DIVISION NUMBER, 402-2 NUMBER OF TIMES, 402-3 ORDER)
- 403: CONNECTION INFORMATION
- 404: (404-1, 404-2, 404-3 PROCESSING INFORMATION)

ELECTRONIC CONTROL APPARATUS, ELECTRONIC CONTROL SYSTEM, AND ELECTRONIC CONTROL METHOD

TECHNICAL FIELD

The present invention relates to an electronic control apparatus, an electronic control system, and an electronic control method.

BACKGROUND ART

Technology development for automatic driving of a vehicle is advanced. In the case of the automatic driving, it is necessary to perform recognition of the surroundings and control of the vehicle instead of a driver, and enormous information processing is required. In order to cope with increasing information processing, an examination using a hardware chip as well as a CPU is advanced.

Various processing according to a state signal indicating a state of the vehicle is executed by a reconfigurable logic circuit using a programmable logic device (PLD) such as a field programmable gate array (FPGA), so that functions of a plurality of electronic control units are realized by one device (refer to PTL 1).

CITATION LIST

Patent Literature

PTL 1: JP 2006-282072 A

SUMMARY OF INVENTION

Technical Problem

In the conventional device, there is a problem that a circuit scale of the logic circuit increases to perform the enormous information processing.

Solution to Problem

An electronic control apparatus according to a first aspect of the present invention is an electronic control apparatus including a reconfigurable logic circuit. The electronic control apparatus includes an information collection unit which collects information; and a processing determination unit which determines a combination of processing information to be executed by the logic circuit, from a processing information storage unit that stores a plurality of pieces of processing information, on the basis of the collected information. The logic circuit is reconfigured on the basis of the combination of processing information determined by the processing determination unit.

An electronic control method according to a second aspect of the present invention includes causing an electronic control apparatus to collect information; and causing the electronic control apparatus to determine a combination of processing information to be executed by a reconfigurable logic circuit, from a processing information storage unit that stores a plurality of pieces of processing information, on the basis of the collected information. The logic circuit is reconfigured on the basis of the determined combination of processing information.

Advantageous Effects of Invention

According to the present invention, a circuit scale of a logic circuit can be decreased.

BRIEF DESCRIPTION OF DRAWINGS

FIG. 3 is a diagram showing an example of a mode DB.

FIG. 4 is a diagram showing an example of a processing information DB 4.

DESCRIPTION OF EMBODIMENTS

Hereinafter, embodiments of the present invention will be described with reference to the drawings.

Figure 1:
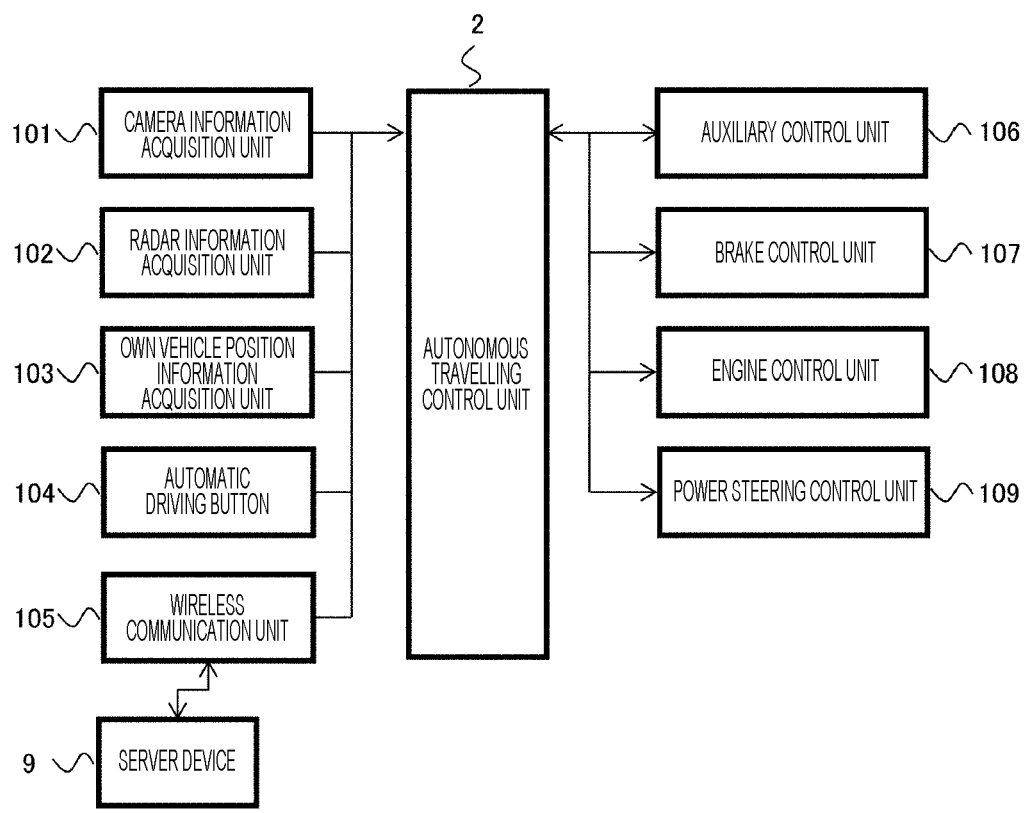
FIG. 1 is a configuration diagram of an in-vehicle system to which an electronic control apparatus according to an embodiment is applied.

FIG. 1 is a configuration diagram of an in-vehicle system to which an electronic control apparatus according to an embodiment is applied. The in-vehicle system includes a camera information acquisition unit 101 that recognizes an external situation of an own vehicle by a camera, a radar information acquisition unit 102 that recognizes the external situation of the own vehicle by a radar, and an own vehicle position information acquisition unit 103 that detects an own vehicle position by a GPS. The in-vehicle system further includes an automatic driving button 104 to start automatic driving control or change an automatic driving mode.

The in-vehicle system further includes a wireless communication unit 105. The wireless communication unit 105 is connected to a server device 9 via a wireless network to update information in the in-vehicle system by OTA (Over-The-Air).

The in-vehicle system according to the present embodiment further includes an autonomous travelling control unit (first electronic control unit (first ECU)) 2, an auxiliary control unit (second ECU) 106, a brake control unit (third ECU) 107, an engine control unit (fourth ECU) 108, and a power steering control unit (fifth ECU) 109.

The camera information acquisition unit 101, the radar information acquisition unit 102, the own vehicle position information acquisition unit 103, the automatic driving button 104, and the wireless communication unit 105 are connected to the autonomous travelling control unit 2. Each sensor information is transmitted from the camera information acquisition unit 101, the radar information acquisition unit 102, and the own vehicle position information acquisition unit 103 to the autonomous travelling control unit 2. Further, an automatic driving control signal is transmitted from the automatic driving button 104 to the autonomous travelling control unit 2 and update of processing information is transmitted from the wireless communication unit 105 to the autonomous travelling control unit 2.

Further, the autonomous travelling control unit 2, the auxiliary control unit 106, the brake control unit 107, the engine control unit 108, and the power steering control unit 109 are connected so as to be able to communicate with each other by a controller area network (CAN).

The autonomous travelling control unit 2 performs processing for automatic driving control, and outputs control commands to the brake control unit 107, the engine control unit 108, and the power steering control unit 109, on the basis of a processing result. The auxiliary control unit 106 performs the same control as that of the autonomous travelling control unit 2 as an auxiliary.

Further, the brake control unit 107 controls the braking force of the vehicle and the engine control unit 108 controls the driving force of the vehicle. Further, the power steering control unit 109 controls the steering of the vehicle.

If the autonomous travelling control unit 2 receives a start request of automatic driving by the automatic driving button 104, the autonomous travelling control unit 2 calculates a movement route of the vehicle, on the basis of external information from the camera information acquisition unit 101, the radar information acquisition unit 102, the own vehicle position information acquisition unit 103, and the like. In addition, the autonomous travelling control unit 2 outputs control commands such as the braking force, the driving force, and the steering to the brake control unit 107, the engine control unit 108, and the power steering control unit 109 so as to move the vehicle along the movement route.

The brake control unit 107, the engine control unit 108, and the power steering control unit 109 receive the control commands from the autonomous travelling control unit 2 and output operation signals to each control target (actuator) not shown in the drawings.

That is, the autonomous travelling control unit 2 is a main control device for outputting the control commands and the brake control unit 107, the engine control unit 108, and the power steering control unit 109 are sub-control devices for controlling the control target according to the control commands from the autonomous travelling control unit 2.

On the other hand, the auxiliary control unit 106 is an auxiliary control device for performing the automatic driving control in place of the autonomous travelling control unit 2, when the autonomous travelling control unit 2 is abnormal.

Figure 2:
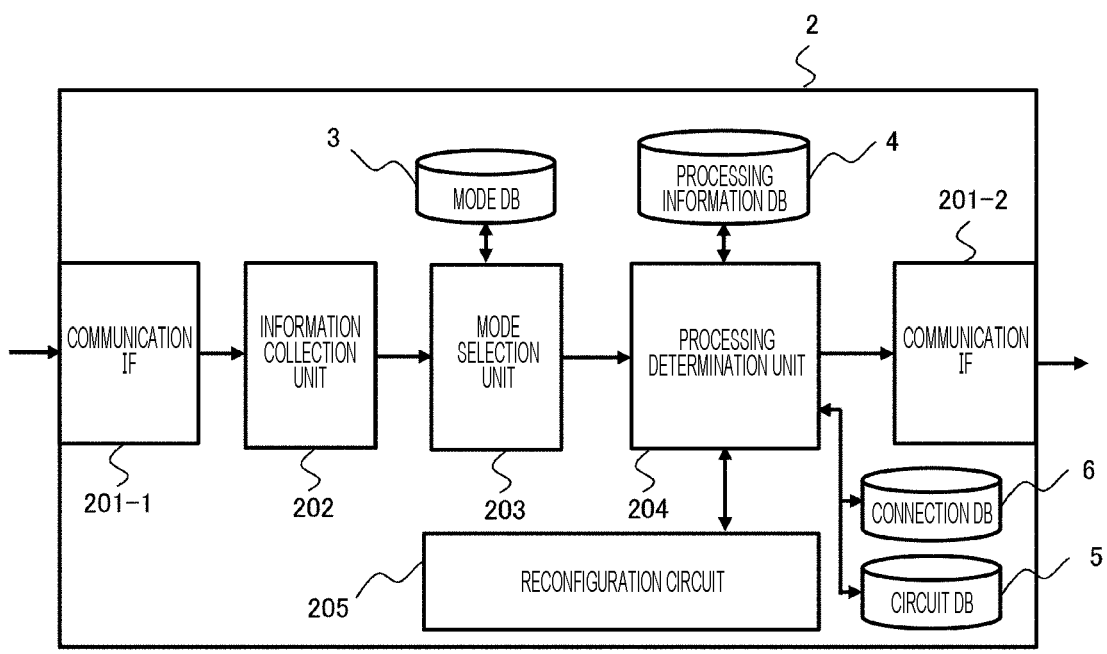
FIG. 2 is a diagram showing a block configuration of an autonomous travelling control unit.

FIG. 2 is a diagram showing a block configuration of the autonomous travelling control unit 2.

The autonomous travelling control unit 2 has a plurality of communication interfaces 201-1 and 201-2 (when the communication interfaces are generically called, they are described as the "communication interface 201"), an information collection unit 202, a mode selection unit 203, a processing determination unit 204, a reconfiguration circuit 205, a mode database (mode DB) 3, a processing information database (processing information DB) 4, a connection database (connection DB) 6, and a circuit database (circuit DB) 5.

The communication interface 201 is an interface performing communication according to a predetermined protocol, such as the CAN used in the general in-vehicle system. The autonomous travelling control unit 2 is connected to other devices via the communication interface 201 and transmits and receives data. In the present embodiment, the autonomous travelling control unit 2 is connected to the camera information acquisition unit 101, the radar information acquisition unit 102, the own vehicle position information acquisition unit 103, the automatic driving button 104, and the wireless communication unit 105 via the communication interface 201-1 and is connected to the auxiliary control unit 106, the brake control unit 107, the engine control unit 108, and the power steering control unit 109 via the communication interface 201-2.

In FIG. 2, the plurality of communication interfaces 201-1 and 201-2 are provided. However, one communication interface 201 may be provided. In this case, the autonomous travelling control unit 2 is connected to the camera information acquisition unit 101, the radar information acquisition unit 102, the own vehicle position information acquisition unit 103, the automatic driving button 104, the wireless communication unit 105, the auxiliary control unit 106, the brake control unit 107, the engine control unit 108, and the power steering control unit 109 via the communication interface 201.

The information collection unit 202 collects sensor information from the camera information acquisition unit 101, the radar information acquisition unit 102, and the own vehicle position information acquisition unit 103, an automatic driving control signal from the automatic driving button 104, and ECU abnormality signals from the brake control unit 107, the engine control unit 108, and the power steering control unit 109, which are input from the communication interface 201-1, and periodically transfers the collected sensor information, automatic driving control signal, and ECU abnormality signal to the mode selection unit 203. Specifically, the information collection unit 202 collects information regarding a travelling situation including expressway travelling, city travelling, or parking of the own vehicle, information regarding a weather situation including sunny, rainy, day, or night, information regarding an emergency situation including an abnormality of the own vehicle, and the like.

The mode selection unit 203 refers to the mode DB 3 on the basis of the sensor information, the automatic driving control signal, the ECU abnormality signal, or the like acquired from the information collection unit 202, and determines an operation mode to be transferred to the processing determination unit 204. The details of the mode DB 3 will be described later with reference to FIG. 3.

The processing determination unit 204 refers to the processing information DB 4 on the basis of the operation mode acquired from the mode selection unit 203, and determines the processing method, the processing information, and the like to be implemented in the corresponding operation mode. The details of the processing information DB 4 will be described later with reference to FIG. 4.

The processing determination unit 204 changes the reconfiguration circuit 205 on the basis of the processing method, the processing information, and the like determined by the processing information DB 4. The reconfiguration circuit 205 is a circuit that executes predetermined processing on data, and is a reconfigurable logic circuit using a programmable logic device (PLD) such as a field programmable gate array (FPGA). The circuit DB 5 stores processing circuit data that is written to a circuit region in the reconfiguration circuit 205 and forms a logic circuit. The connection DB 6 stores connection circuit data that is written in the reconfiguration circuit 205 and forms an interface circuit between the processing determination unit 204 and the logic circuit.

The reconfiguration circuit 205 reconfigures the logic circuit by the processing circuit data and the connection circuit data, which are determined on the basis of the processing method, the processing information, and the like of the processing information DB 4, and executes processing. If the processing is completed, the processing determination unit 204 is notified of completion notification. The processing determination unit 204 outputs the control commands such as the braking force and the driving force from the communication interface 201-2, on the basis of the processing result executed by the logic circuit.

If the information collection unit 202 receives the update of the processing information from the server device 9 via the wireless communication unit 105, the information collection unit 202 updates the contents of the mode DB 3, the processing information DB 4, the circuit DB 5, and the connection DB 6. By this update, it is possible to update the operation mode and the processing to be executed by the reconfiguration circuit 205. An example of the update of the processing information will be described later with reference to FIG. 11.

An example of the case where the autonomous travelling control unit 2 includes the information collection unit 202, the mode selection unit 203, and the processing determination unit 204 and performs processing shown in a flowchart to be described later will be described. However, a program shown in the flowchart may be realized by executing the program by a computer including a CPU, a memory, and the like. Further, the program may be supplied as various forms of computer readable computer program products such as recording media and data signals (carrier waves). Further, from the viewpoint of functional safety of automatic driving, the autonomous travelling control unit 2 may be configured by a processor having a plurality of cores adopting a lockstep type.

Further, the autonomous travelling control unit 2 may be physically configured on one electronic control apparatus or may be logically or physically configured on a plurality of electronic control apparatuses. The program described above may operate on a separate thread on the same electronic control apparatus or may operate on a virtual electronic control apparatus constructed on resources of a plurality of electronic control apparatuses.

FIG. 3 is a diagram showing an example of the mode DB 3.

The mode DB 3 is referred to by the mode selection unit 203 and is a database in which the information acquired from the information collection unit 202 is associated with the operation mode to be output to the processing determination unit 204. Specifically, as shown in FIG. 3, the mode DB 3 stores a mode selection condition 301 and a selected operation mode 302 in association with each other. In addition, the mode selection unit 203 selects the operation mode 302 by referring to the mode DB 3 with the information acquired from the information collection unit 202 as the mode selection condition 301.

For example, as an example of an application to the automatic driving, when it is determined that the vehicle has entered an expressway on the basis of parameter information of the external recognition sensors such as the camera information acquisition unit 101, the radar information acquisition unit 102, and the own vehicle position information acquisition unit 103, this is set as the mode selection condition 301 and a mode 1 is selected as the operation mode 302. Further, in the case of receiving a control signal for automatic parking by the automatic driving button 104, this is set as the mode selection condition 301 and a mode 2 is selected as the operation mode 302. Further, in the case of detecting an abnormality of the ECU as failure detection information, this is set as the mode selection condition 301 and a mode 3 is selected as the operation mode 302. In addition, the mode selection unit 203 may select the operation mode according to at least one of the travelling situation including expressway travelling, city travelling, or parking of the own vehicle, the weather situation including sunny, rainy, day, or night, and the emergency situation including an abnormality of the own vehicle, on the basis of the various information collected by the information collection unit 202.

FIG. 4 is a diagram showing an example of the processing information DB 4.

The processing information DB 4 is referred to by the processing determination unit 204 and is a database in which the operation mode 401 corresponding to the operation mode 302 acquired from the mode selection unit 203 is associated with the processing contents.

The processing information DB 4 stores a processing method 402, connection information 403, and processing information 404 in association with each other, for each operation mode 401. The processing method 402 includes a division number 402-1 of the circuit region of the logic circuit, the number of times 402-2 of processing by the logic circuit, and an order 402-3 of the processing by the logic circuit, and designates a reconfiguration procedure and a processing order of the logic circuit. The connection information 403 designates connection circuit data in the connection DB 6. The processing information 404 includes processing information 1 to processing information 3 (404-1 to 404-3), each of which designates processing circuit data in the circuit DB 5 and stores a time taken for processing. The time taken for processing is stored as a reference for confirming a time taken for the entire processing in designing, and may not be stored in the present embodiment.

For example, when the operation mode 401 is the mode 1, it is designated by the division number 402-1 that one circuit region is provided in the reconfiguration circuit 205. It is designated by the number of times 402-2 that the processing by the logic circuit provided in the reconfiguration circuit 205 is performed three times. It is designated by the order 402-3 that the processing of the processing information 1 (404-1) to the processing information 3 (404-3) are performed in the order. The connection information 403 designates that connection circuit data corresponding to an interface circuit I1 in the connection DB 6 is written to the reconfiguration circuit 205. The processing information 1 (404-1) designates that processing circuit data corresponding to a logic circuit A1 in the circuit DB 5 is written to the reconfiguration circuit 205, and stores a processing time T11 of the logic circuit A1. The processing information 2 (404-2) designates that processing circuit data corresponding to a logic circuit A2 is written to the reconfiguration circuit 205, and stores a processing time T12 of the logic circuit A2. The processing information 3 (404-3) designates that processing circuit data corresponding to a logic circuit A3 is written to the reconfiguration circuit 205, and stores a processing time T13 of the logic circuit A3.

As an example of an application to the automatic driving of the mode 1, the processing information 1 may be set as sensing processing, the processing information 2 may be set as behavior prediction processing of a vehicle or a pedestrian, and the processing information 3 may be set as movement route calculation processing of the vehicle. The details of the reconfiguration circuit in the mode 1 will be described later with reference to FIG. 8.

Further, when the operation mode 401 is the mode 2, it is designated by the division number 402-1 that two circuit regions are provided in the reconfiguration circuit 205. It is designated by the number of times 402-2 that the processing by the logic circuit provided in one region of the reconfiguration circuit 205 is performed two times and the processing by the logic circuit provided in the other region is performed once. It is designated by the order 402-3 that the processing of the processing information 1 (404-1) and the processing information 2 (404-2) are performed in the order by the logic circuit provided in one region and the processing of the processing information 3 (404-3) is performed by the logic circuit provided in the other region. The connection information 403 designates that connection circuit data corresponding to an interface circuit 12 in the connection DB is written to the reconfiguration circuit 205. The processing information 1 (404-1) and the processing information 2 (404-2) designate that processing circuit data corresponding to logic circuits B1 and B2 in the circuit DB 5 is written to one region of the reconfiguration circuit 205, and store processing times T21 and T22 of the logic circuits B1 and B2. The processing information 3 (404-3) designates that processing circuit data corresponding to a logic circuit B3 is written to the other region of the reconfiguration circuit 205, and stores a processing time T23 of the logic circuit B3.

As an example of an application to the automatic driving of the mode 2, the processing information 1 (404-1) to the processing information 3 (404-3) may be set as empty parking space search processing, backward parking processing, and forward parking processing. The details of the reconfiguration circuit in the mode 2 will be described later with reference to FIG. 9.

Further, when the operation mode 401 is the mode 3, it is designated by the division number 402-1 that three circuit regions are provided in the reconfiguration circuit 205. It is designated by the number of times 402-2 that processing by a logic circuit provided in a first region of the reconfiguration circuit 205 is performed once, processing by a logic circuit provided in a second region is performed once, and processing by a logic circuit provided in a third region is performed once. It is designated by the order 402-3 that the processing of the processing information 1 (404-1) to the processing information 3 (404-3) are performed in the order by the logic circuits provided in the first to third regions. The connection information 403 designates that connection circuit data corresponding to an interface circuit 13 in the connection DB 6 is written to the reconfiguration circuit 205. The processing information 1 (404-1) designates that processing circuit data corresponding to a logic circuit C1 in the circuit DB 5 is written to the first region of the reconfiguration circuit 205, and stores a processing time T31 of the logic circuit C1. The processing information 2 (404-2) designates that processing circuit data corresponding to a logic circuit C2 is written to the second region of the reconfiguration circuit 205, and stores a processing time T32 of the logic circuit C2. The processing information 3 (404-3) designates that processing circuit data corresponding to a logic circuit C3 is written to the third region of the reconfiguration circuit 205, and stores a processing time T33 of the logic circuit C3.

Figure 10A:
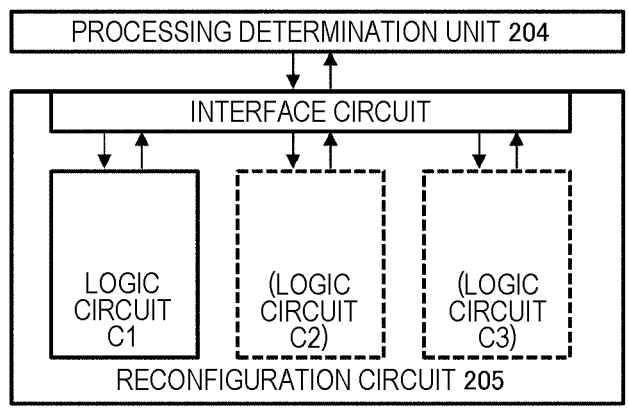
FIGS. 10A to 10C are diagrams showing a configuration example of a reconfiguration circuit in a mode 3.

As an example of an application to the automatic driving of the mode 3, the processing information 1 (404-1) to the processing information 3 (404-3) may be set as track securing processing for stopping the vehicle safely. The details of the reconfiguration circuit in the mode 3 will be described later with reference to FIG. 10.

The processing information DB 4 shown in FIG. 4 is an example. For example, the number of processing information 404 corresponding to the operation mode is not limited to three and may be two or four or more. According to the number of processing information 404, the division number 402-1, the number of times 402-2, and the order 402-3 are also set appropriately.

Figure 5:
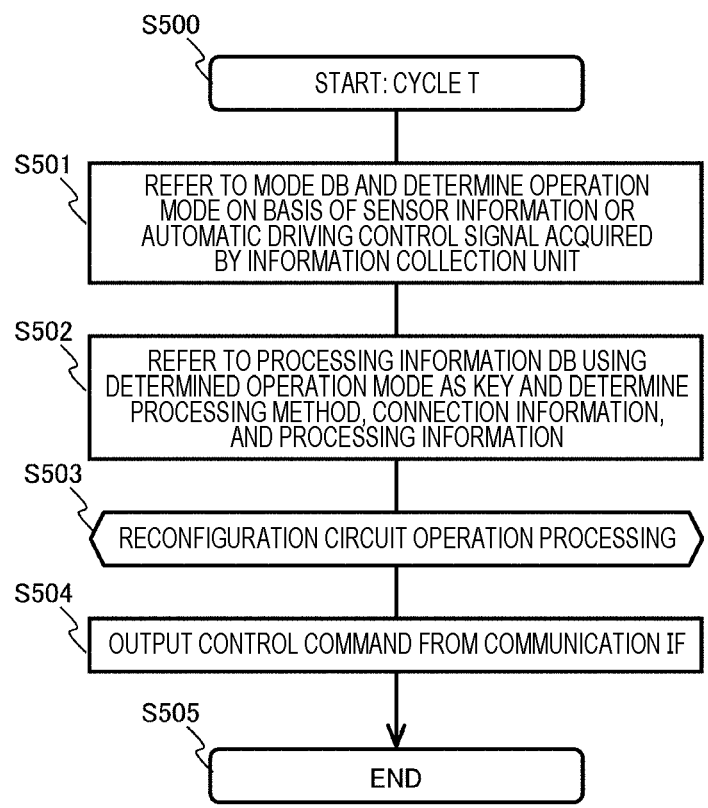
FIG. 5 is a flowchart showing processing of an autonomous travelling control unit.

FIG. 5 is a flowchart showing processing of the autonomous travelling control unit 2.

In the automatic driving, it is required to repeatedly perform various processing such as the sensing processing, the distance calculation processing, the behavior prediction processing of the vehicle and the pedestrian, and the movement route calculation processing of the vehicle. Therefore, the autonomous travelling control unit 2 periodically performs the processing shown in FIG. 5, on the basis of the collected sensor information and automatic driving control signal.

Further, the autonomous travelling control unit 2 manages selection of the operation mode 302 of the automatic driving in the mode DB 3 to execute the various processing described above in the travelling scene, the weather situation, or the emergency situation. Further, the autonomous travelling control unit 2 manages the processing method 402, the connection information 403, and the processing information 404 for each operation mode 401 in the processing information DB 4, reconfigures the logic circuit in the reconfiguration circuit 205, and performs processing.

An processing operation of the autonomous travelling control unit 2 will be described below with reference to the flowchart of FIG. 5.

The autonomous travelling control unit 2 starts the processing shown in FIG. 5 at a periodic interval T. When the autonomous travelling control unit 2 starts the processing (S500), the autonomous travelling control unit 2 refers to the mode DB 3 in the mode selection unit 203, and determines the operation mode 302, on the basis of the sensor information of the external situation and the automatic driving control signal acquired in the information collection unit 202 (S501).

After the processing of S501, the autonomous travelling control unit 2 refers to the processing information DB 4 using the operation mode 302 determined in the mode selection unit 203 as a search key, and determines the processing method 402, the connection information 403, and the processing information 404 (S502).

After the processing of S502, the autonomous travelling control unit 2 executes reconfiguration circuit operation processing (S503). The details of the reconfiguration circuit operation processing will be described later with reference to FIG. 6.

After the processing of S503, the autonomous travelling control unit 2 outputs the control commands such as the braking force and the driving force from the communication interface 201-2 (S504), and ends the processing (S505).

Figure 6:
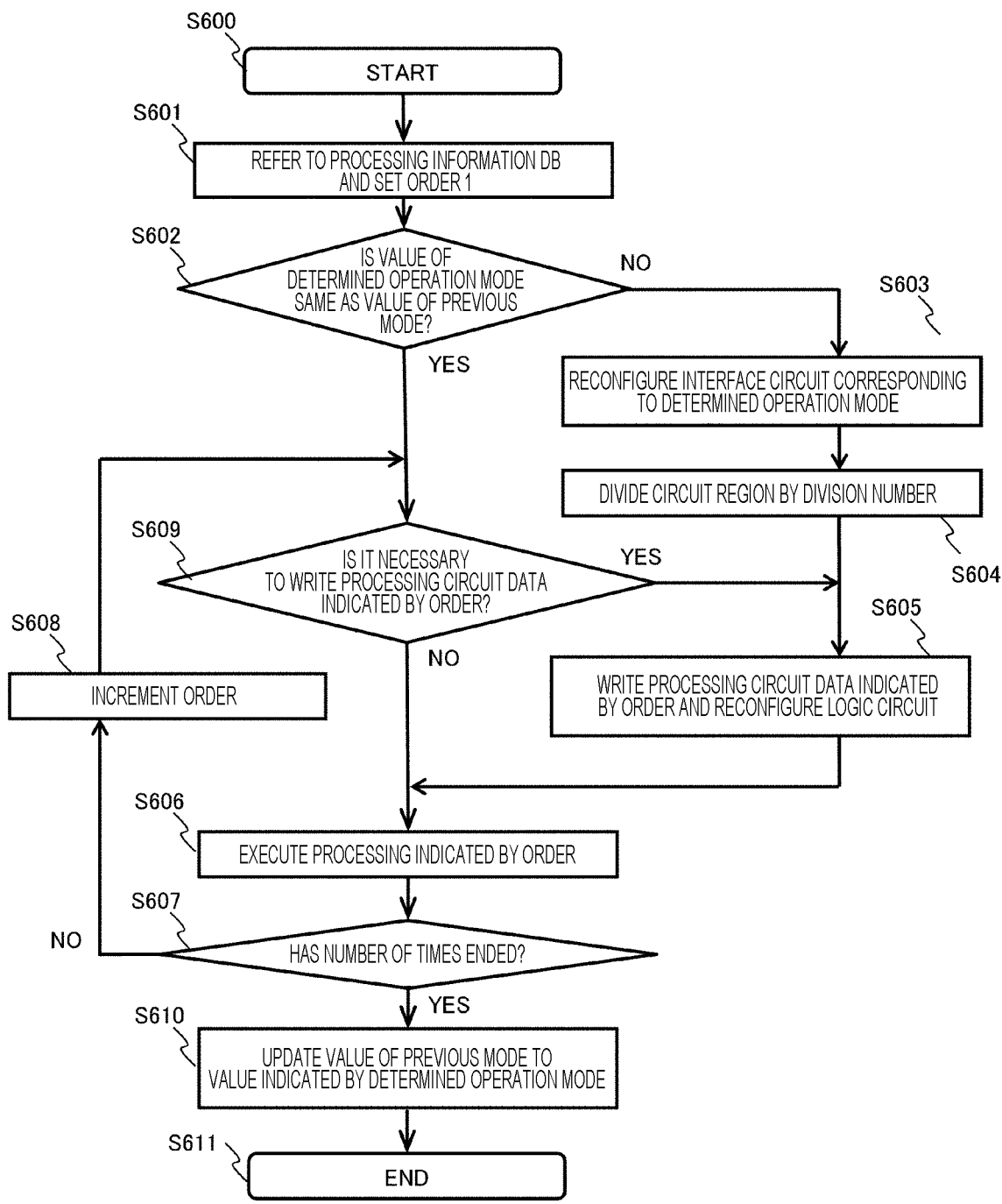
FIG. 6 is a flowchart showing reconfiguration circuit operation processing of an autonomous travelling control unit.

FIG. 6 is a flowchart showing the reconfiguration circuit operation processing of the autonomous travelling control unit 2. The autonomous travelling control unit 2 starts the reconfiguration circuit operation processing in S503 of the processing shown in FIG. 5.

When the autonomous travelling control unit 2 starts the reconfiguration circuit operation processing (S600), the autonomous travelling control unit 2 refers to the processing information DB 4, reads the processing method 402, the connection information 403, and the processing information 404, and sets the order of the processing to 1 (S601).

After the processing of S601, the autonomous travelling control unit 2 determines whether or not a value of the operation mode 302 determined in S501 shown in FIG. 5 is the same as a previously determined mode value (S602).

When it is determined in S602 that the value of the determined operation mode 302 is different from the previous mode value, the autonomous travelling control unit 2 reads the connection information 403 indicated by the determined operation mode 302 from the processing information DB 4, reads the connection circuit data designated by the connection information 403 from the connection DB 6, and writes it to the reconfiguration circuit 205 as an interface circuit with the processing determination unit 204 (S603). That is, the interface circuit corresponding to the determined operation mode is reconfigured. Here, when it is determined in S602 that the value of the determined operation mode 302 is different from the previous mode value, the operation mode is switched and the interface circuit between the reconfiguration circuit 205 and the processing determination unit 204 also needs to be switched. Therefore, in S603, the connection circuit data is written to the reconfiguration circuit 205 and the interface circuit corresponding to the operation mode after switching is reconfigured.

After the processing of S603, the autonomous travelling control unit 2 performs control to divide the circuit region of the reconfiguration circuit 205 by the division number designated by the division number 402-1 of the processing method 402 (S604).

After the processing of S604, the autonomous travelling control unit 2 reads, from the circuit DB 5, the processing circuit data designated by the processing information corresponding to the currently set processing order among the processing information 1 to 3 in the processing information 404, writes the processing circuit data to the reconfiguration circuit 205, and reconfigures the logic circuit (S605). At this time, the circuit region of the logic circuit is reconfigured according to the division number 402-1 designated in S604. Then, the autonomous travelling control unit proceeds to S606.

When it is determined in S602 that the value of the determined operation mode 302 is the same as the previous mode value, the autonomous travelling control unit 2 determines whether or not it is necessary to write the processing circuit data designated by the processing information corresponding to the currently set processing order among the processing information 1 to 3 in the processing information 404 (S609). When it is determined in S609 whether it is necessary to write the processing circuit data, the autonomous travelling control unit 2 reads the processing circuit data from the circuit DB 5, writes the processing circuit data to the reconfiguration circuit 205 (S605), and proceeds to step S606.

When it is determined in S609 that it is not necessary to write the processing circuit data, the autonomous travelling control unit 2 proceeds to step S606. The determination on whether or not it is necessary to write the processing circuit data can be performed from the processing information DB 4, in the processing determination unit 204. For example, when the operation mode 302 determined in S501 of FIG. 5 is the mode 3, it can be seen that the three circuit regions are provided in the reconfiguration circuit 205 from the division number 402-1 and the logic circuits C1, C2, and C3 are reconfigured once in the circuit regions, respectively, from the number of times 402-2, the order 402-3, and the processing information 404. For this reason, if the previous mode value is the same, all the logic circuits necessary for the processing designated by the processing information 404 are already configured in the three circuit regions of the reconfiguration circuit 205 by the previous reconfiguration circuit operation processing. Therefore, in this case, it is determined in S609 that it is not necessary to write the processing circuit data.

Next, in S606, the autonomous travelling control unit 2 executes processing corresponding to the current processing order by the logic circuit reconfigured in S605 or the logic circuit configured by the previous reconfiguration circuit operation processing. After the processing is completed, the autonomous travelling control unit 2 determines whether or not the processing corresponding to the number of times indicated by the number of times 402-2 of the processing method 402 has ended (S607). In S607, when the processing has not ended, the autonomous travelling control unit 2 increments the order of the processing (S608) and returns to step S609.

When it is determined in S607 that the processing has ended, the autonomous travelling control unit 2 updates the previous mode value to the value indicated by the operation mode 302 determined in S501 of FIG. 5 (S610) and ends the reconfiguration circuit operation processing (S610).

Figure 7:
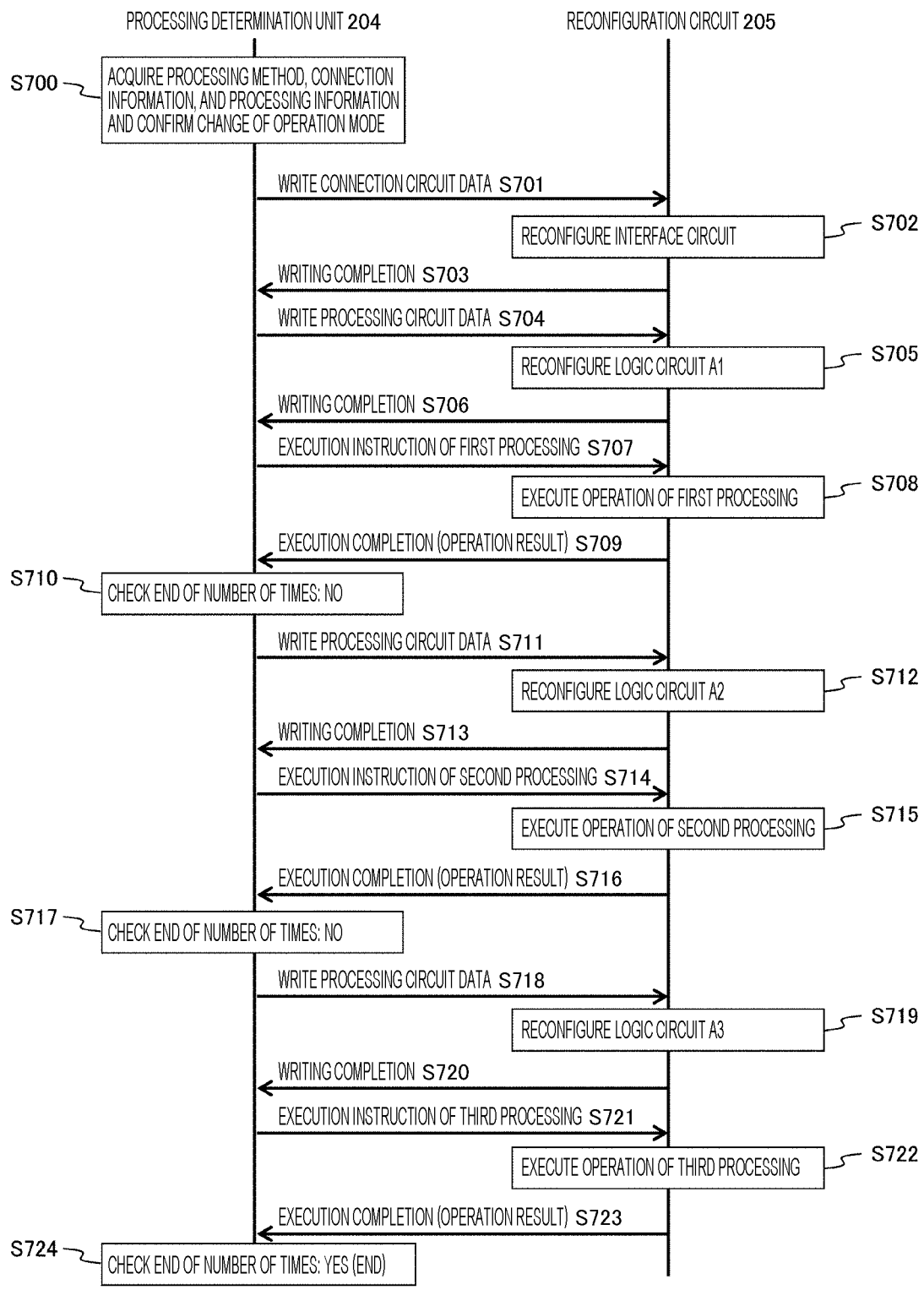
FIG. 7 is a sequence diagram showing an update example of a reconfiguration circuit in an autonomous travelling control unit.

FIG. 7 is a sequence diagram showing an update example of the reconfiguration circuit 205 in the autonomous travelling control unit 2 according to the embodiment. In FIG. 7, an update example when the operation mode 401 of the processing information DB 4 in FIG. 4 is the mode 1 is shown.

First, the processing determination unit 204 acquires the processing method 402, the connection information 403, and the processing information 404 from the processing information DB 4 and confirms the change of the operation mode (S700). Here, an example of the case where there is a mode change is shown.

Next, the processing determination unit 204 writes the connection circuit data of the interface circuit to the reconfiguration circuit 205 (S701). The reconfiguration circuit 205 reconfigures the interface circuit I1 (S702) and notifies the processing determination unit 204 of writing completion (S703). At the time of writing, the reconfiguration circuit 205 may notify the processing determination unit 204 of a state in which the circuit is being reconfigured.

Next, the processing determination unit 204 writes the processing circuit data of the logic circuit A1 designated by the processing information 1 (404-1) to the reconfiguration circuit 205 (S704). The reconfiguration circuit 205 reconfigures the logic circuit A1 on one circuit region designated by the processing method 402 (S705) and notifies the processing determination unit 204 of writing completion (S706).

Next, the processing determination unit 204 notifies the reconfiguration circuit 205 of an execution instruction of first processing (S707). The reconfiguration circuit 205 executes an operation of the first processing (S708) and notifies the processing determination unit 204 of execution completion together with an operation result (processing result) (S709). Here, the processing determination unit 204 may hold the operation result of the first processing and may use it for an operation of subsequent processing.

Next, the processing determination unit 204 checks an end of the number of times (S710). Here, an example of the case where the operation mode 401 is the mode 1, the number of times does not end, and there is next processing (second processing) is shown.

Next, the processing determination unit 204 writes the processing circuit data of the logic circuit A2 designated by the processing information 2 (403-2) to the reconfiguration circuit 205 (S711). The reconfiguration circuit 205 reconfigures the logic circuit A2 on one circuit region indicated by the processing method 402 (S712) and notifies the processing determination unit 204 of writing completion (S713).

Next, the processing determination unit 204 notifies the reconfiguration circuit 205 of an execution instruction of the second processing (S714). The reconfiguration circuit 205 executes an operation of the second processing (S715) and notifies the processing determination unit 204 of execution completion together with an operation result (processing result) (S716). Here, the processing determination unit 204 may hold the operation result of the second processing and may use it for an operation of subsequent processing.

Next, the processing determination unit 204 checks an end of the number of times (S717). Here, an example of the case where the operation mode 401 is the mode 1, the number of times does not end, and there is next processing (third processing) is shown.

Next, the processing determination unit 204 writes the processing circuit data of the logic circuit A3 designated by the processing information 3 (403-3) to the reconfiguration circuit 205 (S718). The reconfiguration circuit 205 reconfigures the logic circuit A3 on one circuit region indicated by the processing method 402 (S719) and notifies the processing determination unit 204 of writing completion (S720).

Next, the processing determination unit 204 notifies the reconfiguration circuit 205 of an execution instruction of the third processing (S721). The reconfiguration circuit 205 executes an operation of the third processing (S722) and notifies the processing determination unit 204 of execution completion together with an operation result (processing result) (S723). Here, the processing determination unit 204 may hold the operation result of the third processing and may use it for an operation of subsequent processing.

Next, the processing determination unit 204 checks an end of the number of times (S724). Here, the operation mode 401 is the mode 1, the number of times of three times ends, and an update sequence of the reconfiguration circuit 205 ends.

Figure 8A:
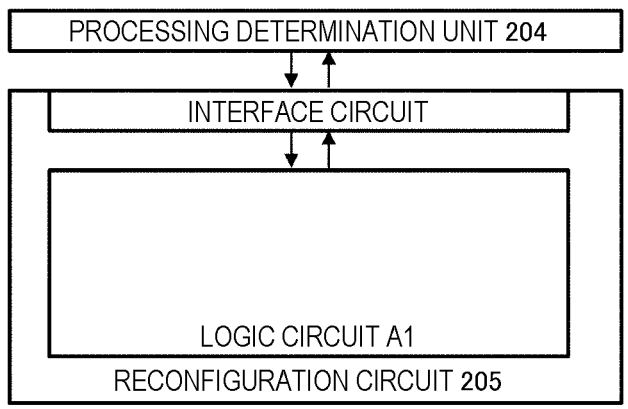
FIGS. 8A to 8C are diagrams showing a configuration example of a reconfiguration circuit in a mode 1.
Figure 8B:
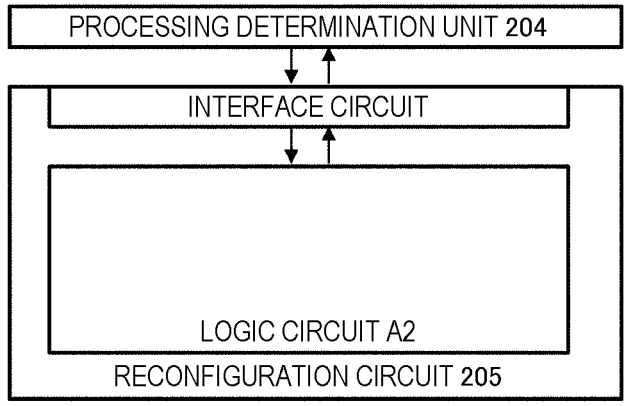
Figure 8C:
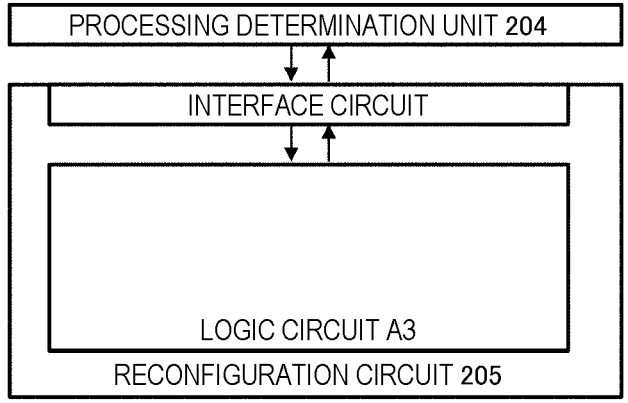
Figure 9A:
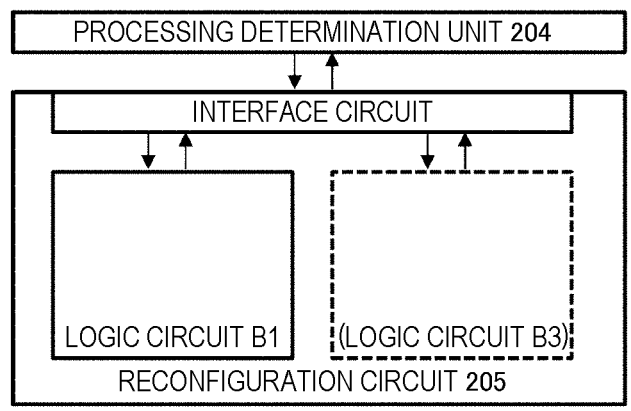
FIGS. 9A to 9C are diagrams showing a configuration example of a reconfiguration circuit in a mode 2.
Figure 9B:
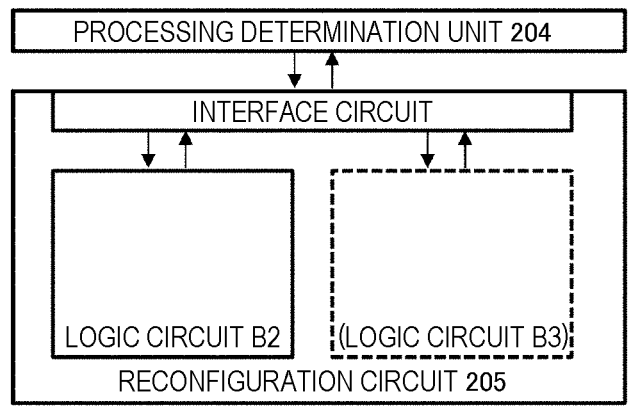
Figure 9C:
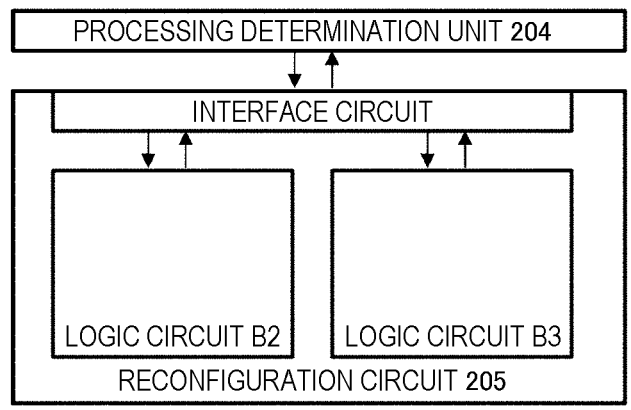

FIG. 8 is a diagram showing a configuration example of the reconfiguration circuit 205 in the mode 1, FIG. 9 is a diagram showing a reconfiguration example of the reconfiguration circuit 205 in the mode 2, and FIG. 10 is a diagram showing a configuration example of the reconfiguration circuit 205 in the mode 3.

In each of FIGS. 8 to 10, (a) shows a state in which a logic circuit of the first processing is configured, (b) shows a state in which a logic circuit of the second processing is configured, and (c) shows a state in which a logic circuit of the third processing is configured.

In FIG. 8, in the mode 1, one circuit region is provided on the reconfiguration circuit 205 and processing of the processing information 1 (404-1), processing of the processing information 2 (404-2), and processing of the processing information 3 (404-3) are sequentially performed on the circuit region.

In FIG. 8(*a*), the reconfiguration circuit 205 is provided with one circuit region designated by the processing method 402, and the logic circuit A1 for executing the first processing of the mode 1 is configured on the basis of the processing circuit data designated by the processing information 404. Further, in the reconfiguration circuit 205, an interface circuit is configured on the basis of the connection information 403 and is connected to the processing determination unit 204.

In FIG. 8(*b*), in the reconfiguration circuit 205, the logic circuit A2 for executing the second processing of the mode 1 is configured on one circuit region indicated by the processing method 402.

In FIG. 8(*c*), in the reconfiguration circuit 205, the logic circuit A3 for executing the third processing of the mode 1 is configured on one circuit region indicated by the processing method 402.

Here, a configuration change of the reconfiguration circuit 205 in the mode 1 will be described using the example of the update sequence shown in FIG. 7. The autonomous travelling control unit 2 configures the interface circuit in S702 and configures the logic circuit A1 of FIG. 8(*a*) in S705. Further, the autonomous travelling control unit 2 configures the logic circuit A2 of FIG. 8(*b*) in S712 and configures the logic circuit A3 of FIG. 8(*c*) in S719.

FIG. 9 is a diagram showing the reconfiguration circuit 205 of the mode 2 in the autonomous travelling control unit 2. In the mode 2, the circuit region is divided into two parts, and the processing of the processing information 1 (404-1) and the processing of the processing information 2 (404-2) are sequentially performed on one region and the processing of the processing information 3 (404-3) is performed on the other region.

In FIG. 9(*a*), the reconfiguration circuit 205 is provided with two circuit regions designated by the processing method 402, and the logic circuit B1 for executing the first processing of the mode 2 is configured on one (the left side in the drawing) circuit region. The other (the right side in the drawing) region is shown by a dotted line because a circuit of this region is not determined by the value of the previous operation mode when the logic circuit B1 of the first processing is configured. When the previous operation mode is the same mode 2, the logic circuit B3 is configured on the right region. Further, in the reconfiguration circuit 205, an interface circuit is provided and is connected to the processing determination unit 204.

In FIG. 9(*b*), in the reconfiguration circuit 205, the logic circuit B2 for executing the second processing of the mode 2 is configured on one circuit region. Similar to FIG. 9(*a*), the other circuit region is shown by a dotted line because a circuit of this region is not determined by the value of the previous operation mode when the logic circuit B2 of the second processing is configured.

In FIG. 9(*c*), in the reconfiguration circuit 205, in a state where the logic circuit B2 for executing the second processing of the mode 2 is configured on one circuit region, the logic circuit B3 for executing the third processing of the mode 2 is configured on the other circuit region.

Here, since the logic circuit B3 is configured on the other circuit region in the mode 2, the logic circuit B3 does not need to be reconfigured when a next operation mode is the same mode 2.

FIG. 10 is a diagram showing the reconfiguration circuit 205 of the mode 3 in the autonomous travelling control unit 2. In the mode 3, the circuit region is divided into three parts and the processing of the processing information 1 (404-1), the processing of the processing information 2 (404-2), and the processing of the processing information 3 (404-3) are sequentially performed.

In FIG. 10(*a*), the reconfiguration circuit 205 is provided with three circuit regions designated by the processing method 402, and the logic circuit C1 for executing the first processing of the mode 3 is configured on one (the left side in the drawing) circuit region. The other two (the center side and the right side in the drawing) regions are shown by dotted lines because circuits of these regions are not determined by the value of the previous operation mode when the logic circuit C1 of the first processing is configured. When the previous operation mode is the same mode 3, the logic circuit C2 is configured on the center region and the logic circuit C3 is configured on the right region. Further, in the reconfiguration circuit 205, an interface circuit is provided and is connected to the processing determination unit 204.

Figure 10B:
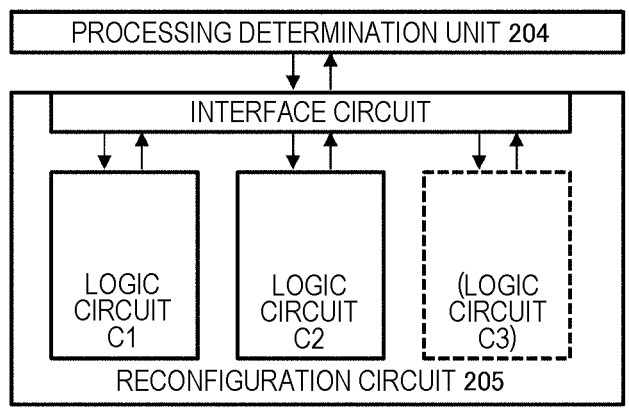

In FIG. 10(b), in the reconfiguration circuit 205, in a state where the logic circuit C1 for executing the first processing of the mode 3 is configured on the left circuit region, the logic circuit C2 for executing the second processing of the mode 3 is configured on the center circuit region. Similar to FIG. 10(a), the right circuit region is shown by a dotted line because a circuit of this region is not determined by the value of the previous operation mode when the logic circuit C2 of the second processing is configured.

Figure 10C:
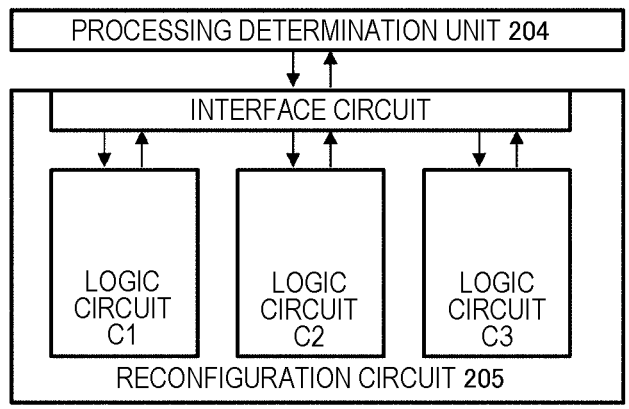

In FIG. 10(c), in the reconfiguration circuit 205, in a state where the logic circuit C1 for executing the first processing of the mode 3 is configured on the left circuit region and the logic circuit C2 for executing the second processing of the mode 3 is configured on the center circuit region, the logic circuit C3 for executing the third processing of the mode 3 is configured on the right circuit region.

Here, the logic circuit C1 is configured on the left side, the logic circuit C2 is configured on the center side, and the logic circuit C3 is configured on the right side, in mode 3. Therefore, when a next operation mode is the same mode 3, each of the logic circuits C1 to C3 does not need to be reconfigured.

In the present embodiment, the autonomous travelling control unit 2 changes the circuit region to be reconfigured for each operation mode and configures the logic circuits for executing the first to third processing for each operation mode within a range of the region. However, when the first to third processing implemented by the operation mode are switched, the circuit regions to be reconfigured may be changed. Further, the interface circuit is set as a fixed circuit having a large number of input/output lines and the logic circuit of each processing is configured to be connected to any one of the fixed input/output lines, or when the logic circuits of the first to third processing are configured, the interface circuit may always be rewritten.

Further, in the present embodiment, the autonomous travelling control unit 2 executes the first to third processing one by one. However, when a plurality of processes that can be executed independently are executed, the plurality of processes may be executed in parallel, in a plurality of divided circuit regions.

In the present embodiment, when a large operation load is required like the expressway entrance (mode 1) in the automatic driving processing, a high performance circuit can be configured by enlarging the circuit region of the reconfiguration circuit 205. On the other hand, when an operation load is not large like the parking (mode 2) in the automatic driving processing, it is possible to divide the circuit region of the reconfiguration circuit 205 into a plurality of parts, shorten the time required for reconfiguration, and speed up processing response by the reconfigured logic circuit. In the case where the circuit region of the reconfiguration circuit 205 is divided into a plurality of parts like the mode 2 or the mode 3, when the same mode is executed immediately before, the time required for reconfiguring the logic circuit can be saved by using the logic circuit reconfigured immediately before, depending on the circuit region. As described above, the logic circuit can be reconfigured according to the operation load required for the operation mode of the automatic driving and the various automatic driving processing can be executed on the reconfiguration circuit 205.

Figure 11:
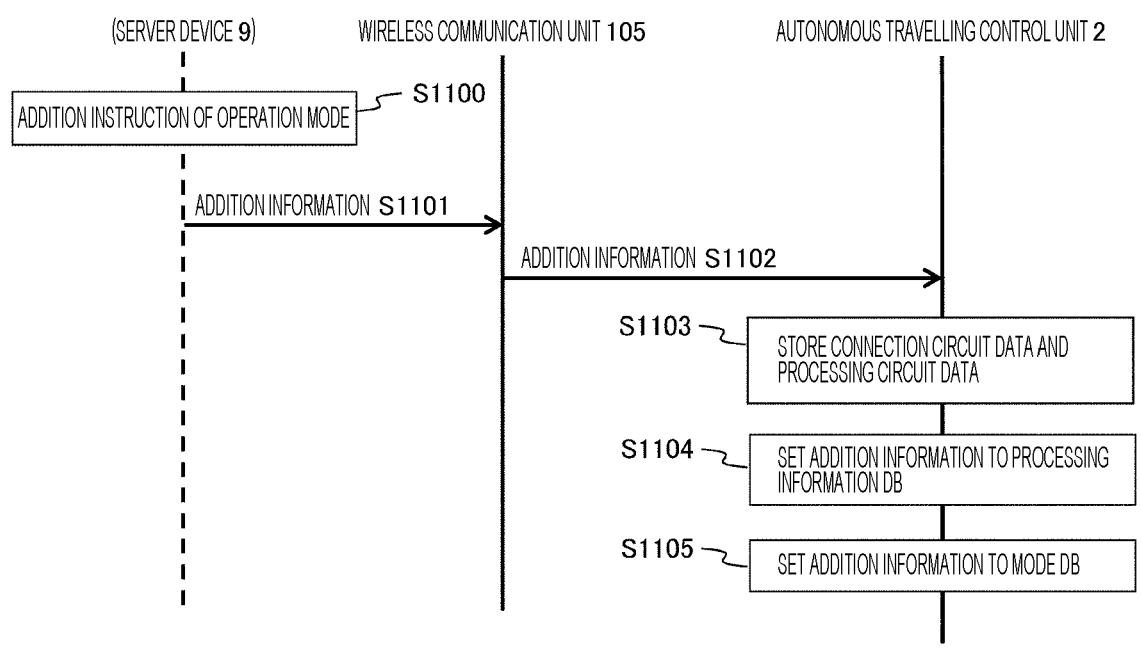
FIG. 11 is a sequence diagram showing information reception from a server device to an autonomous travelling control unit.

FIG. 11 is a sequence diagram showing information reception from the server device 9 to the autonomous travelling control unit 2.

In FIG. 11, an example of adding an operation mode of the automatic driving via a wireless network by OTA (Over The Air) from a server on a cloud or the like is shown.

First, when an addition instruction of an operation mode is set to the server device 9 (S1100), information regarding the operation mode to be added (contents of the mode DB 3 and the processing information DB 4 and processing circuit data and connection circuit data used in the operation mode to be added) is transferred to the wireless communication unit 105 of the in-vehicle system (S1101).

Next, the wireless communication unit 105 transfers the received addition information to the autonomous travelling control unit 2 (S1102).

Next, the autonomous travelling control unit 2 stores the processing circuit data and the connection circuit data in the circuit DB 5 and the connection DB 6 (S1103). Further, the autonomous travelling control unit 2 sets the operation mode 401, the processing method 402, the connection information 403, and the processing information 404 to be added to the processing information DB 4 (S1104).

Then, the autonomous travelling control unit 2 adds the mode selection condition 301 and the operation mode 302 of the operation mode to be added to the mode DB 3 (S1105) and completes the processing.

According to the present embodiment, when a new operation mode of the automatic driving is added, it is possible to additionally introduce, into the autonomous travelling control unit, circuit data or a processing method to be used in the operation mode to be added, without affecting the operation mode that is being used. Therefore, in the electronic control apparatus applied to the in-vehicle system, even if a circuit scale of a logic circuit is small, logic circuits according to various combination processing can be configured.

According to the embodiment described above, the following functions and effects are obtained.

(1) The autonomous travelling control unit 2 is an electronic control apparatus including the reconfiguration circuit 205 that is a reconfigurable logic circuit. The autonomous travelling control unit 2 includes the information collection unit 202 which collects information; and the processing determination unit 204 which determines a combination of processing information to be executed by the reconfiguration circuit 205, from the processing information DB 4 that stores a plurality of pieces of processing information, on the basis of the collected information. The reconfiguration circuit 205 is reconfigured on the basis of the combination of processing information determined by the processing determination unit 204. As a result, a circuit scale of a logic circuit can be decreased.

(2) An electronic control system has the autonomous travelling control unit 2 and the wireless communication unit 105 connected to a network. The autonomous travelling control unit 2 updates the processing information to be stored by the processing information DB 4, on the basis of the information collected from the wireless communication unit 105. As a result, a circuit scale of a logic circuit can be decreased and logic circuits according to various combination processing can be configured.

(Modifications)

The present invention can be implemented with the following modifications of the embodiments described above.

(1) The configuration including the mode selection unit 203 for selecting an operation mode from the mode DB 3 that stores a plurality of operation modes has been described. However, the mode DB may not necessarily be provided. In that case, the mode selection unit 203 determines the operation mode, on the basis of the information collected by the information collection unit 202, and outputs the determined operation mode to the processing determination unit 204.

The present invention is not limited to the embodiments described above, and other forms considered within the scope of the technical idea of the present invention are also included in the scope of the present invention as long as the features of the present invention are not impaired. Further, the embodiments and a plurality of modifications may be configured to be combined.

The disclosure contents of the following priority basic application are incorporated herein by reference.

Japanese Patent Application No. 2016-245896 (filed on Dec. 19, 2016)

REFERENCE SIGNS LIST 2 autonomous travelling control unit
3 mode DB
4 processing information DB
101 camera information acquisition unit
102 radar information acquisition unit
103 own vehicle position information acquisition unit
104 automatic driving button
105 wireless communication unit
106 auxiliary control unit
107 brake control unit
108 engine control unit
109 power steering control unit
201 communication interface
202 information collection unit
203 mode selection unit
204 processing determination unit
205 reconfiguration circuit

The invention claimed is:

1. An electronic control apparatus including a reconfigurable logic circuit, comprising:
an information collection unit which collects information; and
a processing determination unit which determines a combination of processing information to be executed by the logic circuit, from a processing information storage unit that stores a plurality of pieces of processing information, on a basis of the collected information,
wherein the logic circuit is reconfigured on a basis of the combination of processing information determined by the processing determination unit,
wherein the processing information storage unit stores a division number of a circuit region where the logic circuit is reconfigured, and
the processing determination unit divides the circuit region based on the division number and reconfigures the logic circuit in each divided circuit region.

2. The electronic control apparatus according to claim 1, further comprising:
an operation mode storage unit which stores a correspondence between the collected information and an operation mode; and
a mode selection unit which selects the operation mode from the operation mode storage unit, on a basis of the collected information,
wherein the processing determination unit determines the combination of processing information to be executed by the logic circuit, on a basis of the operation mode selected by the mode selection unit.

3. The electronic control apparatus according to claim 1, wherein the processing information storage unit stores the number of times of reconfiguring the logic circuit, and
the processing determination unit reconfigures the logic circuit on a basis of the number of times.

4. The electronic control apparatus according to claim 1, wherein the processing information storage unit stores an order in which the logic circuit is reconfigured, and
the processing determination unit reconfigures the logic circuit on a basis of the order.

5. The electronic control apparatus according to claim 2, wherein the information collection unit collects at least one of information regarding a travelling situation including expressway travelling, city travelling, or parking of an own vehicle, information regarding a weather situation including sunny, rainy, day, or night, and information regarding an emergency situation including an abnormality of the own vehicle.

6. The electronic control apparatus according to claim 5, wherein the mode selection unit selects the operation mode according to at least one of the travelling situation including expressway travelling, city travelling, or parking of the own vehicle, the weather situation including sunny, rainy, day, or night, and the emergency situation including the abnormality of the own vehicle, on a basis of the information collected by the information collection unit.

7. An electronic control system, comprising:
the electronic control apparatus according to claim 1; and
a communication unit connected to a network,
wherein the electronic control apparatus updates the processing information to be stored by the processing information storage unit, on a basis of processing information collected from the communication unit.

8. An electronic control method, comprising:
causing an electronic control apparatus to collect information; and
causing the electronic control apparatus to determine a combination of processing information to be executed by a reconfigurable logic circuit, from a processing information storage unit that stores a plurality of pieces of processing information, on a basis of the collected information,
wherein the logic circuit is reconfigured on a basis of the determined combination of processing information,
wherein the processing information storage unit stores a division number of a circuit region where the logic circuit is reconfigured, and
the circuit region is divided based on the division number and the logic circuit is reconfigured in each divided circuit region.

* * * * *